United States Patent
Chang et al.

(10) Patent No.: US 9,419,155 B2
(45) Date of Patent: Aug. 16, 2016

(54) SENSING PRODUCT AND METHOD OF MAKING

(75) Inventors: Shih-Chieh Chang, Taipei (TW); Yu-Ku Lin, Tainan (TW); Ying-Lang Wang, Tien-Chung Village (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 622 days.

(21) Appl. No.: 13/343,922

(22) Filed: Jan. 5, 2012

(65) Prior Publication Data

US 2013/0175653 A1    Jul. 11, 2013

(51) Int. Cl.
  *H01L 31/0232*  (2014.01)
  *H01L 31/101*  (2006.01)
  *H01L 31/18*  (2006.01)

(52) U.S. Cl.
  CPC .......... *H01L 31/0232* (2013.01); *H01L 31/101* (2013.01); *H01L 31/18* (2013.01)

(58) Field of Classification Search
  CPC .................................................. H01L 27/1464
  USPC ............................. 438/56, 57, 66, 70, 71, 73
  See application file for complete search history.

(56) References Cited

U.S. PATENT DOCUMENTS

| | | | |
|---|---|---|---|
| 6,429,036 B1 | 8/2002 | Nixon et al. | |
| 2007/0063299 A1* | 3/2007 | Hwang | 257/432 |
| 2007/0152250 A1 | 7/2007 | Kim | |
| 2008/0265297 A1* | 10/2008 | Han | 257/292 |
| 2011/0140220 A1* | 6/2011 | Marty et al. | 257/432 |
| 2011/0266645 A1 | 11/2011 | Chao | |

OTHER PUBLICATIONS

Franssila, S. (2010) Chapter 4: Silicon, in Introduction to Microfabrication, Second Edition, John Wiley & Sons, Ltd, Chichester, UK., pp. 35-46.*

* cited by examiner

*Primary Examiner* — Brett Feeney
*Assistant Examiner* — Erik T Peterson
(74) *Attorney, Agent, or Firm* — Hauptman Ham, LLP

(57) ABSTRACT

This description relates to a sensing product formed using a substrate with a plurality of epi-layers. At least a first epi-layer has a different composition than the composition of a second epi-layer. The sensing product optionally includes at least one radiation sensing element in the second epi-layer and optionally an interconnect structure over the second epi-layer. The sensing product is formed by removing the substrate and all epi-layers other than the second epi-layer. A light incident surface of the second epi-layer has a total thickness variation of less than about 0.15 μm.

11 Claims, 4 Drawing Sheets

SENSING PRODUCT AND METHOD OF MAKING

BACKGROUND

Sensing products are used in a variety of camera arrangements, including backside illumination sensors, and are sometimes used in low light environments. Several sensing products rely on passing light through a semiconductor layer for sensing incident light. The semiconductor layer is thin enough to allow light to propagate, however, some techniques of layer thinning create a semiconductor layer having a significant thickness variation across the layer. Variations in the layer's thickness result in uneven propagation of light through the semiconductor layer, which in turn prevents the sensor from collecting accurate data resulting in decreased image clarity.

A total thickness variation of the light incident surface for the sensing product resulting from some techniques produces image distortion in an image captured by the sensing product. Some techniques create a total thickness variation of a light incident surface of 0.20 µm or greater. As the total thickness variation increases, the amount of image distortion increases.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
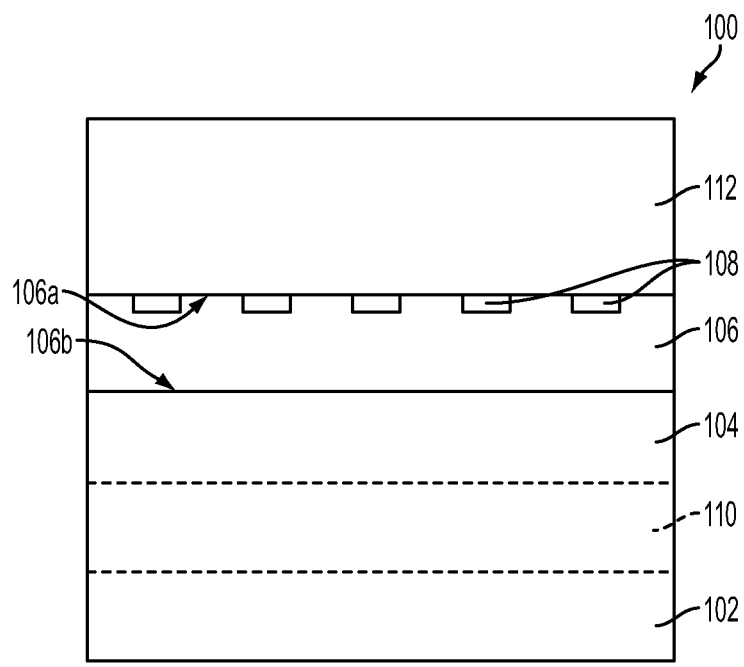
FIG. 1 is a side view of an intermediate product of a sensing product according to some embodiments.

FIG. 1 is a side view of an intermediate product 100 of a backside illumination sensor according to some embodiments. The intermediate product 100 includes a substrate 102. A first epi-layer 104 is over the substrate 102. The intermediate product also includes a second epi-layer 106 over the substrate 102. In some embodiments, optional radiation sensing elements 108 are in the second epi-layer 106, and in some embodiments, an optional interconnect structure 112 is over the second epi-layer 106 and electrically connected to the radiation sensing elements 108. In some embodiments a single optional intervening epi-layer 110 is between the first epi-layer 104 and the substrate 102. In some embodiments, a plurality of optional intervening epi-layers is between the first epi-layer 104 and the substrate 102. In other embodiments, the intermediate product 100 does not comprise an intervening epi-layer.

The first epi-layer 104 is the closest epi-layer to the second epi-layer 106. The second epi-layer 106 has a different composition than the composition of the first epi-layer 104. Each of the first epi-layer 104 and the second epi-layer 106 independently comprises at least one core material and optionally at least one dopant. In some embodiments, the second epi-layer 106 has a different at least one core material than the at least one core material of the first epi-layer 104. In some embodiments, the second epi-layer 106 has a different at least one dopant than the at least one dopant of the first epi-layer 104.

In some embodiments, the total thickness variation of the second epi-layer 106 is less than about 0.15 µm. This range, in some embodiments, is narrower, e.g., from 0.1 µm to 0.15 µm. In some embodiments, the second epi-layer 106 has a total thickness variation ranging from about 6% of the thickness of the second epi-layer 106 to about 10% of the thickness of the second epi-layer 106. This range, in some embodiments, is narrower, e.g., from 6% of the thickness of the second epi-layer 106 to 10% of the thickness of the second epi-layer 106. In some embodiments, the total thickness variation is measured using a metrology tool to measure the thickness of the second epi-layer at various points across a surface of the second epi-layer prior to forming the backside illumination sensor. The thickness of the second epi-layer 106 is measured from interface 106a, the interface furthest from the substrate 102, to the opposite interface 106b, the interface closest to the substrate 102. The difference between the maximum thickness measured and the minimum thickness measured is the total thickness variation. A total thickness variation less than or equal to about 0.15 µm makes it possible to reduce the amount of distortion of light passing through the second epi-layer 106.

In some embodiments, the substrate 102 comprises at least one core material and optionally at least one dopant. The at least one core material, in some embodiments, comprises silicon, germanium, carbide, oxide, gallium arsenide, indium phosphate or another suitable material. In some embodiments, the substrate is an alloy. In some embodiments, the substrate 102 is a non-conductive material. In some embodiments, the substrate 102 is a conductive material or semi-conductive material. In some embodiments, the substrate is p-doped or n-doped (i.e., positive doped or negative doped). The at least one dopant, in some embodiments, includes boron, aluminum, gallium, indium, or other suitable materials.

In some embodiments, the thicknesses of first epi-layer 104 and second epi-layer 106 are independently less than 5.0 µm. In some embodiments, the thicknesses of the first epi-layer 104 and the second epi-layer 106 independently range from about 1.0 µm to about 2.2 µm. This range, in some embodiments, is narrower, e.g., from 1.0 µm to 2.2 µm. In some embodiments, the thicknesses of the first epi-layer 104 and the second epi-layer 106 differ. In some embodiments, the thicknesses of the first epi-layer 104 and the second epi-layer 106 are measured using the same metrology tool used to measure the total thickness variation of the second epi-layer. In other embodiments, the thicknesses of the first epi-layer 104 and the second epi-layer 106 are measured using a different metrology tool.

The first epi-layer 104, the second epi-layer 106 and the at least one intervening layer 110 independently comprise at least one core material and optionally at least one dopant. The at least one core material, in some embodiments, independently comprises silicon, germanium, carbide, oxide, gallium arsenide, indium phosphate or another suitable material. In some embodiments, the first epi-layer 104, the second epi-layer 106 and the at least one intervening layer 110 are independently an alloy or non-alloy. In some embodiments, the first epi-layer 104, the second epi-layer 106 and the at least one intervening layer 110 are independently a non-conductive material, a conductive or a semi-conductive material. In some embodiments, the first epi-layer 104, the second epi-layer 106 and the at least one intervening layer 110 independently are p-doped or n-doped. The at least one dopant, in some embodiments, includes boron, aluminum, gallium, indium, or other suitable materials.

In some embodiments, the substrate 102, the first epi-layer 104, the second epi-layer 106 and the at least one intervening layer 110 have the same at least one core material. In some embodiments, the substrate 102, the first epi-layer 104, the second epi-layer 106 and the at least one intervening layer 110 have different at least one core materials. In some embodiments, some of the substrate 102, the first epi-layer 104, the second epi-layer 106 and the at least one intervening layer 110 have the same at least one core material, and some of the substrate 102, the first epi-layer 104, the second epi-layer 106 and the at least one intervening layer 110 have different at least one core materials.

In some embodiments, the first epi-layer 104 and the second epi-layer 106 are independently n-doped or p-doped. The at least one dopants, in some embodiments, are independently chosen from those identified above. In some embodiments, the type of dopant, i.e., negative dopant or positive dopant, is different for the first epi-layer 104 than the second epi-layer 106.

In some embodiments, the dopant concentrations in the substrate 102, the first epi-layer 104, second epi-layer 106 and at least one intervening epi-layer 110 independently range from about $10^{14}$ atoms/cm$^3$ to about $10^{20}$ atoms/cm$^3$. This range, in some embodiments, is narrower, e.g., from $10^{14}$ atoms/cm$^3$ to $10^{20}$ atoms/cm$^3$.

In some embodiments, the n-dopant concentrations in the substrate 102, the first epi-layer 104, second epi-layer 106 and at least one intervening epi-layer 110 independently range from about $10^{14}$ atoms/cm$^3$ to about $10^{16}$ atoms/cm$^3$. This range, in some embodiments, is narrower, e.g., from $10^{14}$ atoms/cm$^3$ to $10^{16}$ atoms/cm$^3$.

In some embodiments, the p-dopant concentrations independently range from about $10^{14}$ atoms/cm$^3$ to about $10^{16}$ atoms/cm$^3$. This range, in some embodiments, is narrower, e.g., from $10^{14}$ atoms/cm$^3$ to $10^{16}$ atoms/cm$^3$.

In some embodiments, the substrate 102, the first epi-layer 104, second epi-layer 106 and at least one intervening epi-layer 110 have the same dopant concentration. In some embodiments, the substrate 102, the first epi-layer 104, second epi-layer 106 and at least one intervening epi-layer 110 have different dopant concentrations.

In some embodiments, the at least one intervening epi-layer 110 comprises silicon. In some embodiments, the at least one intervening epi-layer 110 is p-doped silicon or n-doped silicon. For each intervening epi-layer, suitable dopants, in some embodiments, are independently chosen from those identified above.

In some embodiments, the first epi-layer 104 is p-doped silicon, the second epi-layer 106 is n-doped silicon and the at least one intervening layer 110 is n-doped silicon. In other embodiments, the first epi-layer 104 is n-doped silicon, the second epi-layer 106 is p-doped silicon and the at least one intervening layer 110 is p-doped silicon.

In some embodiments, the substrate 102 has opposite doping type (n-dopant or p-dopant) to the doping type of the first epi-layer 104 or the at least one intervening epi-layer 110. In other embodiments, the substrate 102 has the same doping type as the doping type of the first epi-layer 104 or the at least one intervening epi-layer 110. In some embodiments, the substrate 102 is p-doped, the at least one intervening layer 110 is n-doped, the first epi-layer 104 is p-doped and the second epi-layer 106 is n-doped. In some embodiments, the substrate 102 is n-doped, the at least one intervening layer 110 is p-doped, the first epi-layer 104 is n-doped and the second epi-layer 106 is p-doped. In some embodiments without at least one intervening layer 110, the substrate 102 is p-doped, the first epi-layer 104 is n-doped and the second epi-layer 106 is p-doped. In some embodiments without at least one intervening layer 110, the substrate 102 is n-doped, the first epi-layer 104 is p-doped and the second epi-layer 106 is n-doped.

In the embodiment of FIG. 1, the intermediate product 100 includes optional radiation sensing elements 108 to detect incident light. In some embodiments, the radiation sensing elements 108 are photodiodes. In some embodiments, the radiation sensing elements 108 are photogates, reset transistors, source follower transistors, transfer transistor, or other suitable light detecting elements. In some embodiments, the intermediate product 100 comprises a plurality of radiation sensing elements 108. In some embodiments, the intermediate product 100 comprises a single radiation sensing element. In some embodiments, the intermediate product 100 comprises an array of radiation sensing elements 108.

Interconnect structure 112 includes lines and vias configured to electrically connect to the radiation sensing elements 108. In some embodiments, the lines are metal lines. In some embodiments, interconnect structure 112 further includes additional circuitry configured to analyze the signals from the at least one radiation sensing element 108.

The intermediate product 100 is subject to multiple uses. In some embodiments, the intermediate product 100 is used to form a sensing product, e.g., an optical sensor, suitable for use in a detector or a camera. These and other products, e.g., a backside illumination sensor, comprise the second epi-layer 106 optionally having a total thickness variation less than or equal to about 0.15 µm, which makes it possible to reduce the amount of distortion of light passing through the second epi-layer 106. If the sensing product is in a camera, using epi-layer 106 makes it possible to produce higher resolution images than light in a camera having an incident surface having a larger total thickness variation.

In some embodiments, the sensing product comprises the second epi-layer 106, the at least one radiation sensing element 108 and the interconnect structure 112, wherein the second epi-layer 106 is configured to receive and transmit incident light. In some embodiments, the sensing product is the intermediate product 100, with the substrate 102, the first epi-layer 104 and any of the at least one intervening epi-layer 110 removed. In some embodiments, the sensing product has a light incident surface corresponding to the surface 106b of the second epi-layer 106.

The total thickness variation of the sensing product permits more even light propagation through the second epi-layer 106 and to the at least one radiation sensing element 108 than some techniques. The more even propagation of light makes it possible to achieve better performance of the sensing product and higher quality images are obtainable from the sensing product.

In some embodiments, the sensing product includes additional post-production elements, such a color filter, a microlens, an antireflective coating, a buffer layer, or other suitable elements formed over surface 106b of the second epi-layer 106.

Figure 2:
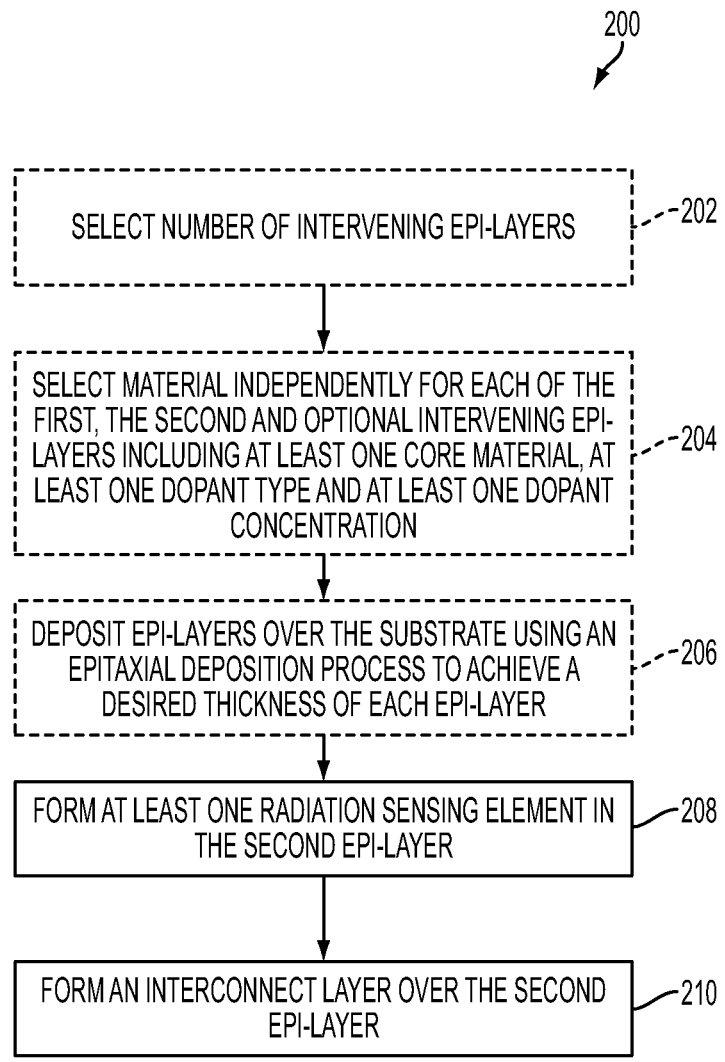
FIG. 2 is a flowchart of a method of making the intermediate product of FIG. 1, according to some embodiments.
Figure 3A:
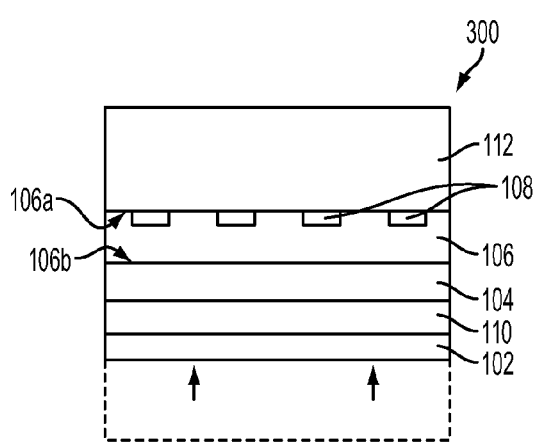
FIGS. 3A-3E are side views of a sensing product during various stages of development according to some embodiments.
Figure 3B:
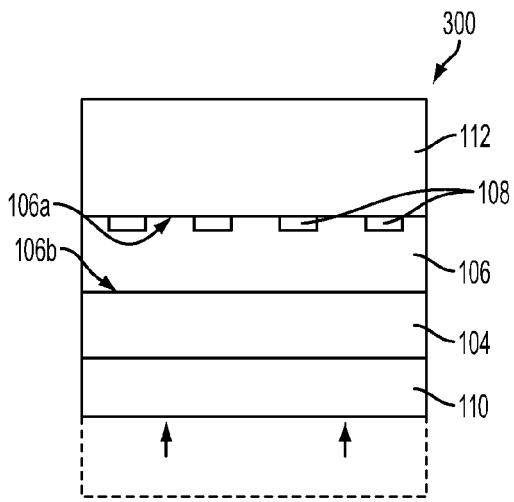
Figure 3C:
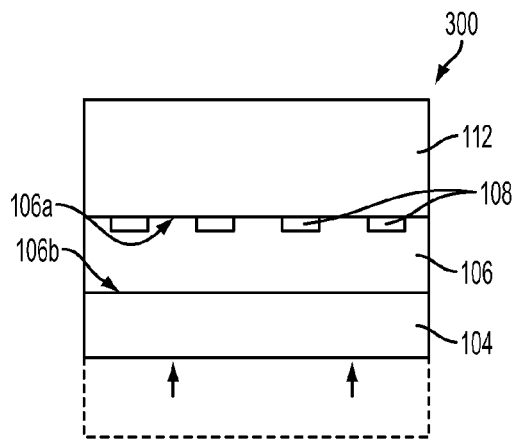
Figure 3D:
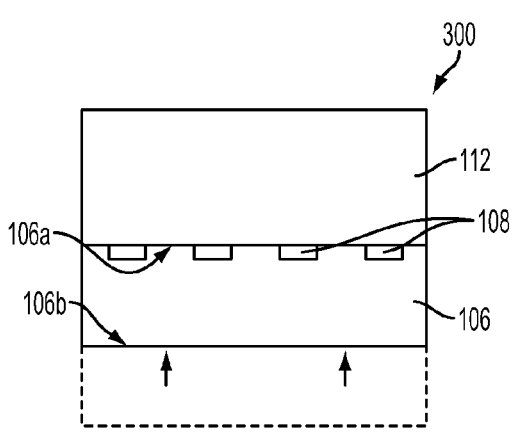
Figure 3E:
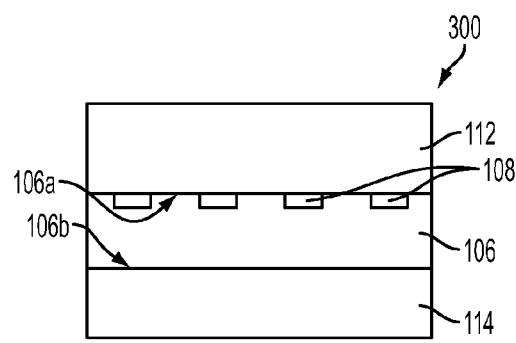

FIG. 2 depicts a flow chart of a method 200 of making the intermediate product 100. Method 200 includes forming at least one radiation sensing element 108 in the second epi-layer 106 and forming the interconnect structure 112 over the second epi-layer 106 to electrically connect to the at least one radiation sensing element 108.

Method 200 begins with optional step 202, in which a number of the at least one intervening epi-layer 110 is selected. The intermediate product 100 of FIG. 1, e.g., includes a single intervening epi-layer 110.

Method 200 continues with optional step 204, in which the materials for the epi-layers are selected. The material selection includes selection of the at least one core material and optionally the at least one dopant. The at least one core material and the at least one dopant are selected from those discussed above. The material selection step further includes selecting the dopant type (e.g., n-type or p-type) and concentration.

In optional step 206, the at least one intervening epi-layer 110, the first epi-layer 104 and the second epi-layer 106 are formed over substrate 102 using an epitaxial deposition process. In some embodiments, the epitaxial deposition process is vapor-phase. In other embodiments, the epitaxial deposition process is liquid-phase or solid-phase. The epitaxial deposition process comprises depositing a crystalline layer over a surface by adsorbing atoms or molecules onto the surface. The deposition process continues until the epi-layer reaches a desired thickness.

Method 200 continues with step 208, in which the at least one radiation sensing element 108 is formed in surface 106a of the second epi-layer 106. In some embodiments, the at least one radiation sensing element 108 is formed by ion implantation. In some embodiments, etching trenches into the second epi-layer 106 and filling the trenches with radiation sensing material to form at least one radiation sensing element 108. In some embodiments, the at least one radiation sensing element 108 is formed by depositing radiation sensing material on surface 106a and heating to diffuse the radiation sensing material in the second epi-layer 106. In some embodiments, the radiation sensing material includes silicon, germanium, indium gallium arsenide, lead sulfide, or other suitable materials.

In some embodiments, isolation features are formed between radiation sensing elements 108. In some embodiments, isolation features are formed by etching a trench in the second epi-layer 106 and filling the trench with dielectric material.

In step 210, interconnection layer 112 is formed over surface 106a of the second epi-layer 106 to provide an electrical connection to the at least one radiation sensing element 108. In some embodiments, depositing a dielectric layer, etching openings and forming lines and vias, forms interconnection layer 112. Other methods of forming interconnection layer 112 would be recognizable by one of ordinary skill in the art.

FIGS. 3A-3E are diagrams of a side view of a sensing product 300 at various stages of development according to some embodiments. Elements of the sensing product 300 are similar to the elements of the intermediate product 100. In the embodiment of FIGS. 3A-3E, the substrate 102 comprises p-doped silicon; the at least one intervening layer 110 comprises n-doped silicon, the first epi-layer 104 comprises p-doped silicon and the second epi-layer 106 comprises n-doped silicon. In some embodiments, other at least one core material and at least one dopant are independently selected for the substrate 102, the at least one intervening layer 110, the first epi-layer 104 and the second epi-layer 106.

Figure 4:
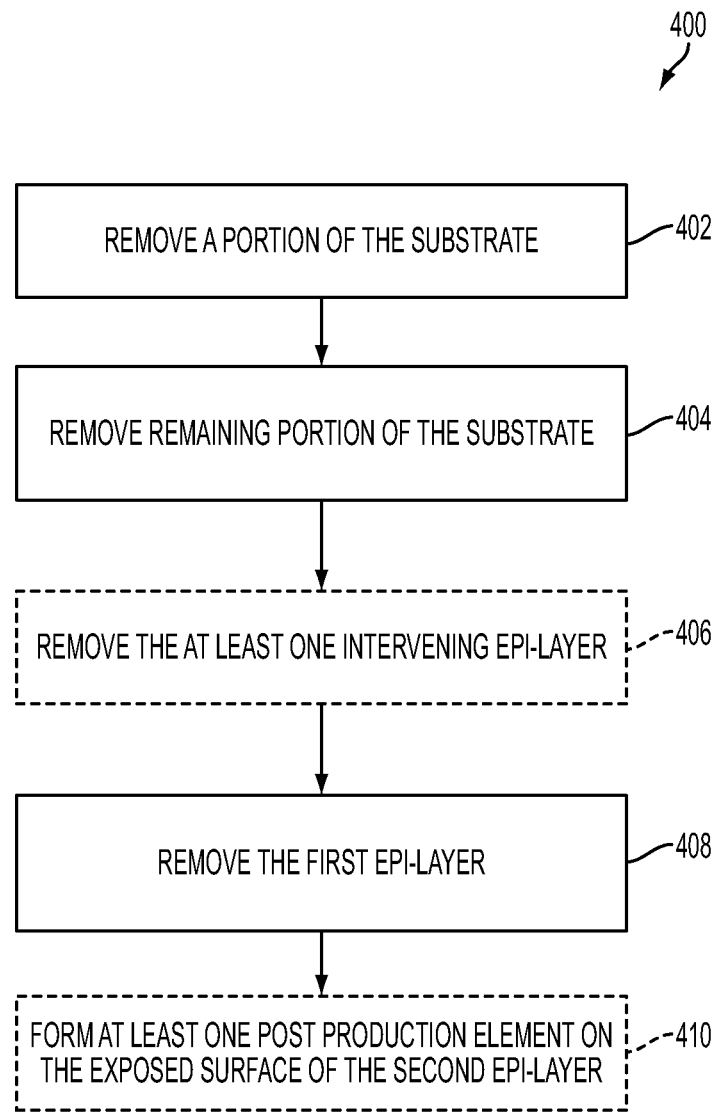
FIG. 4 is a flowchart of a method of making a sensing product, according to some embodiments.

FIG. 4 depicts a flow chart for a method 400 of making sensing product 300 according to some embodiments. Method 400 includes removing the substrate 102 from the intermediate product 100 and thereafter removing the first epi-layer 104 to expose the surface 106b of the second epi-layer 106.

Method 400 begins with step 402, in which a portion of the substrate 102 is removed. In some embodiments, the substrate 102 is removed using a grinding process. The grinding process includes using a grinding wheel to remove a portion of the substrate 102.

The remaining portion of the substrate 102 is removed in step 404. In some embodiments, the remaining portion of the substrate 102 is removed using an etching process. In some embodiments, the etching process is a selective etching processes. In some embodiments, the grinding of step 402 is continued until substantially all of the substrate 102 is removed. In the embodiment of FIGS. 3A-3E, the substrate 102 is p-doped silicon and etching includes a wet etching process contacting an aqueous solution comprising hydrofluoric acid, nitric acid, and acetic acid (HNA) with the substrate 102. In the embodiment of FIGS. 3A-3E, the at least one intervening epi-layer 110 is n-doped silicon. HNA etches the p-doped silicon of substrate 102 at a much higher rate than the n-doped silicon of the at least one intervening epi-layer 110. In some embodiments, other selective etching etchants are selected based upon the composition, including at least one core material and the at least one dopant, of the substrate 102, the optional at least one intervening layer 110, the first epi-layer 104 and the second epi-layer 106. Following step 404, the substrate 102 is substantially or entirely removed.

In some embodiments, when the composition, including the at least one core material and the at least one dopant, for the substrate 102 is the same as the composition of the at least intervening one epi-layer 110, the selective etching process is continued to remove the at least one intervening epi-layer 110 as well as the substrate 102. In some embodiments, when the composition of the first epi-layer 104 is the same as the composition of the at least one intervening epi-layer 110 and the composition of the substrate 102, the selective etching process is continued to remove the first epi-layer 104, the at least one intervening epi-layer 110 and the substrate 102.

In the embodiment of FIGS. 3A-3E, the at least one intervening epi-layer 110 is removed in step 406. In some embodiments, the at least one intervening epi-layer 110 is removed using chemical and mechanical planarization. In other embodiments, the at least one intervening epi-layer 110 is removed using a selective etching process or another process. Chemical and mechanical planarization (CMP) uses a carrier wafer to securely hold the sensing product 300 in contact with a pad on a platen. The platen and the carrier are rotated to strip the portion of the sensing product 300 contacting the pad. In some embodiments, a polishing slurry or other polishing solution is added to the pad to assist in the removal process. The polishing slurry or other polishing solution are selected based on the material removed during the CMP process. Following step 406, substantially all of or the entire at least one intervening epi-layer 110.

In step 408, the first epi-layer 104 is removed. In some embodiments, the first epi-layer 104 is removed using selective etching. In other embodiments, the first epi-layer 104 is removed using chemical and mechanical planaraization or other suitable material removal processes. In the embodiments of FIGS. 3A-3E, the first epi-layer 104 is p-doped silicon and is selective etched using HNA similar to the etching of substrate 102 in step 404. In some embodiments, other selective etching etchants are selected based upon the composition, including at least one core material and the at least one dopant, of the substrate 102, the optional at least one intervening layer 110, the first epi-layer 104 and the second epi-layer 106. Once the first epi-layer 104 is removed, surface 106b of the second epi-layer 106 is exposed. At this point a metrology tool is used to measure the total thickness variation of the second epi-layer 106.

The second epi-layer 106 has a sufficiently small total thickness variation, to effectively propagate light to the radiation sensing elements 108. In some embodiments, the sufficiently small total thickness variation of the second epi-layer 106 results from the epitaxial deposition process and the highly selective etching of the adjacent layer.

Method 400 optionally continues with step 410, in which post production elements 114 are attached to the surface 106b of the second epi-layer 106. In some embodiments, post production elements include a color filter, a microlens, a protective buffer layer, or other suitable elements.

In some embodiments, the sensing product 300 is a camera, such as a backside illumination sensor.

One aspect of the description relates to a manufacture including a substrate, a first epi-layer, and a second epi-layer, where the second epi-layer had a different material than the first epi-layer.

Another aspect of the description relates to a method of making a semiconductor device comprising in an intermediate product including a substrate, a first epi-layer, and a second epi-layer, where the second epi-layer has a different material than the first epi-layer. The method further includes forming at least one radiation sensing element in the second epi-layer of the intermediate product and forming an interconnect layer over the second epi-layer of the intermediate product to electrically connect with the at least one radiation sensing element.

Still another aspect of the description relates to a method of making a semiconductor device comprising in an intermediate product comprising a substrate, a first epi-layer, a second epi-layer, where the second epi-layer has a different material than the first epi-layer, at least one radiation sensing element in the second epi-layer, and an interconnect layer over the second epi-layer and configured to electrically connect to the at least one radiation sensing element. The method of making the semiconductor device further includes removing the substrate from the intermediate product and thereafter removing the first epi-layer to expose a surface of the second epi-layer.

The above description discloses exemplary steps, but they are not necessarily required to be performed in the order described. Steps can be added, replaced, changed in order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of making a semiconductor device, the method comprising:
    forming at least one radiation sensing element in a second epi-layer of an intermediate product, wherein the intermediate product comprises a substrate, a first epi-layer over the substrate and the second epi-layer over the first epi-layer, wherein the second epi-layer has a different composition from the first epi-layer, and the second epi-layer has a doped surface extending across the entire second epi-layer in a direction parallel to an interface between the first epi-layer and the substrate;
    forming an interconnect layer over the second epi-layer of the intermediate product to electrically connect with the at least one radiation sensing element; and
    removing the substrate and the entire first epi-layer to expose the entire doped surface of the second epi-layer.

2. The method of claim 1, wherein the forming the at least one radiation sensing element comprises forming the at least one radiation sensing element in the second epi-layer having a total thickness variation of less than about 0.15 microns ($\mu$m).

3. The method of claim 1, wherein the forming the at least one radiation sensing elements comprises at least one of ion implantation, etching a trench, or diffusing a radiation sensing material in the second epi-layer.

4. A method of making a semiconductor device comprising:
    forming at least one radiation sensing element in a first epi-layer having a first dopant type, wherein the first epi-layer is over a second epi-layer having a second dopant type and a substrate, wherein the first dopant type is opposite the second dopant type, and the first epi-layer comprises a doped surface extending parallel to an interface between the substrate and the second epi-layer;
    forming an interconnect layer over the first epi-layer, the interconnect layer electrically connected with the at least one radiation sensing element;
    removing a portion of the substrate using a first process; and
    removing the entire second epi-layer using a second process different from the first process, wherein removing the second epi-layer comprises exposing the entire doped surface of the first epi-layer having a total thickness variation of less than about 0.15 microns ($\mu$m), and the doped surface extends across every radiation sensing element of the at least one radiation sensing element.

5. The method of claim 4, wherein removing the second epi-layer using the second process comprises removing a portion of the substrate using the second process.

6. The method of claim 5, wherein removing the second epi-layer using the second process comprises removing the second epi-layer using a grinding or planarization process.

7. The method of claim 5, wherein removing the second epi-layer using the second process comprises removing the second epi-layer using a selective etching process.

8. The method of claim 4, wherein forming the at least one radiation sensing element in the first epi-layer comprises forming the at least one radiation sensing element in the first epi-layer comprising a silicon core material, and the second epi-layer comprises the silicon core material.

9. The method of claim 4, wherein forming the at least one radiation sensing element comprises forming a plurality of radiation sensing elements.

10. The method of claim 4, wherein forming the at least one radiation sensing element in the first epi-layer comprises forming the at least one radiation sensing element in the first epi-layer having a dopant concentration ranging from about $10^{14}$ atoms/cm$^3$ to about $10^{20}$ atoms/cm$^3$.

11. The method of claim 4, wherein forming the at least one radiation sensing element in the first epi-layer comprises forming the at least one radiation sensing element in the first epi-layer having a first dopant concentration, and the second epi-layer has a second dopant concentration different from the first dopant concentration.

* * * * *